United States Patent
Zheng

(10) Patent No.: US 10,357,768 B2
(45) Date of Patent: Jul. 23, 2019

(54) MEMS DEVICE AND FABRICATION METHOD THEREOF

(71) Applicant: Semiconductor Manufacturing International (Shanghai) Corporation, Shanghai (CN)

(72) Inventor: Chao Zheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/249,439

(22) Filed: Aug. 28, 2016

(65) Prior Publication Data

US 2017/0057816 A1 Mar. 2, 2017

(30) Foreign Application Priority Data

Aug. 28, 2015 (CN) .......................... 2015 1 0540807

(51) Int. Cl.
*H01L 21/71* (2006.01)
*B01L 3/00* (2006.01)

(52) U.S. Cl.
CPC .................................. *B01L 3/5027* (2013.01)

(58) Field of Classification Search
CPC B81C 1/00; B81B 1/00; H01L 27/144; H01L 27/14643; H01L 27/14687; H01L 27/14601; H01L 31/035281
USPC ........................................................ 257/466
See application file for complete search history.

(56) References Cited

U.S. PATENT DOCUMENTS

| | | | | |
|---|---|---|---|---|
| 2002/0008080 A1* | 1/2002 | Song | ................... | H01L 21/0334 216/51 |
| 2006/0258098 A1* | 11/2006 | Lee | ................... | H01L 21/76229 438/258 |
| 2009/0162989 A1* | 6/2009 | Cho | ................... | H01L 21/76229 438/427 |
| 2012/0133077 A1* | 5/2012 | Mizawa | ................... | B29C 33/56 264/293 |
| 2014/0342557 A1* | 11/2014 | Diem | ................... | H01L 21/3083 438/689 |

* cited by examiner

*Primary Examiner* — Matthew C Landau
*Assistant Examiner* — Dmitriy Yemelyanov
(74) *Attorney, Agent, or Firm* — Anova Law Group, PLLC

(57) ABSTRACT

A method for fabricating an MEMS device includes providing a first substrate with a central region and a peripheral region, and forming a plurality of first openings in the peripheral region and a plurality of third openings in the central region by etching the first substrate from a front side. The depth of the first openings is larger than the depth of the third openings. The method further includes forming a photosensitive layer on the surfaces of the first openings and the third openings, bonding a second substrate to the front side of the first substrate, and forming a trench by etching the first substrate from a back side using a patterned mask layer as an etch mask. The trench has a concave bottom surface and exposes a portion of the photosensitive layer formed on the bottom surfaces of the first openings and the third openings.

18 Claims, 11 Drawing Sheets

MEMS DEVICE AND FABRICATION METHOD THEREOF

CROSS-REFERENCES TO RELATED APPLICATIONS

This application claims the priority of Chinese Patent Application No. CN201510540807.9, filed on Aug. 28, 2015, the entire content of which is incorporated herein by reference.

FIELD OF THE DISCLOSURE

The present disclosure generally relates to the field of semiconductor fabrication technology and, more particularly, relates to an MEMS device and fabrication methods thereof.

BACKGROUND

A micro-electro mechanical system (MEMS) often includes a micro structure, a micro sensor, a micro actuator, and corresponding processing circuits, etc. MEMS technology is a frontier high-tech subject that has been developed based on integration of various micro-processing techniques and applications of the latest achievements in modern information technology.

The development of MEMS technology has opened up a whole new technical field and a new industry. Fabricated by MEMS technology, micro sensors, micro actuators, micro component parts, micro mechanical optical devices, vacuum micro electronic devices, power electronic devices, etc., have very broad application prospects in aviation, aerospace, automotive, biomedical, environmental monitoring, military, and almost every single field that people may be able to practice.

Currently, the fabrication method for MEMS devices in the field of optics may include providing a substrate and forming a plurality of openings in the substrate by etching the substrate from the front side to the back side. The depth of the openings may be smaller than the thickness of the substrate. After forming the plurality of openings, the fabrication method may also include forming a photosensitive layer on the bottom and the sidewall surfaces of the openings. Further, the fabrication method also includes providing a carrier board and then bonding the substrate to the carrier board. Specifically, the front side of the substrate may be bonded to the carrier board so that the environment in the openings is nearly a vacuum. The fabrication method further includes forming a trench on the back side of the substrate by removing a portion of the substrate from the back side through etching. The trench exposes the portion of the photosensitive layer formed on the bottom surface of the openings.

However, for MEMS devices formed by such a current method, the sensing ability on external lights may still need to be improved while the performance may be poor. The disclosed fabrication method and MEMS device are directed to solve one or more problems set forth above and other problems in the art.

BRIEF SUMMARY OF THE DISCLOSURE

One aspect of the present disclosure includes a method for fabricating an MEMS device. The method includes providing a first substrate with an open region. The first substrate includes a front side and, opposite to the front side, a back side, and the open region includes a central region and a peripheral region surrounding the central region. The method further includes forming a plurality of first openings in the first substrate in the peripheral region and a plurality of third openings in the first substrate in the central region by etching the first substrate in the open region from the front side to the back side. The depth of the first openings in the first substrate is larger than the depth of the third openings in the first substrate, and the depth of the first openings and the depth of the third openings are both smaller than the thickness of the first substrate. The method also includes forming a photosensitive layer on bottom and sidewall surfaces of the first openings and also on bottom and sidewall surfaces of the third openings, providing a second substrate, and bonding the second substrate to the front side of the first substrate. Further, the method includes forming a patterned mask layer on the back side of the first substrate to expose a portion of the back side surface of the first substrate corresponding to the open region, and forming a trench in the first substrate by a dry etching process using the patterned mask layer as an etch mask and along an etching direction from the back side of the first substrate to the front side of the first substrate. The trench has a concave bottom surface towards the front side of the first substrate, and a portion of the photosensitive layer formed on the bottom surfaces of the first openings and the bottom surfaces of the third openings is exposed in the trench.

Another aspect of the present disclosure provides an MEMS device. The MEMS device includes an open region on a first substrate. The first substrate includes a front side and, opposite to the front side, a back side, and the open region includes a central region and a peripheral region surrounding the central region. The MEMS device further includes a plurality of first openings formed in the first substrate in the peripheral region and a plurality of third openings formed in the first substrate in the central region. The depth of the first openings in the first substrate is larger than the depth of the third opening in the first substrate and the depth of the first openings and the depth of the third openings are both smaller than the thickness of the first substrate. The MEMS device also includes a photosensitive layer formed on bottom and sidewall surfaces of the first openings and also on bottom and sidewall surfaces of the third openings, a second substrate bonded to the front side of the first substrate, and a trench formed on the back side of the first substrate opposite to the open region. A bottom surface of the trench has a concave shape towards the front side of the first substrate and the trench exposes a portion of the photosensitive layer formed on the bottom surfaces of the first openings and the bottom surfaces of the third openings.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
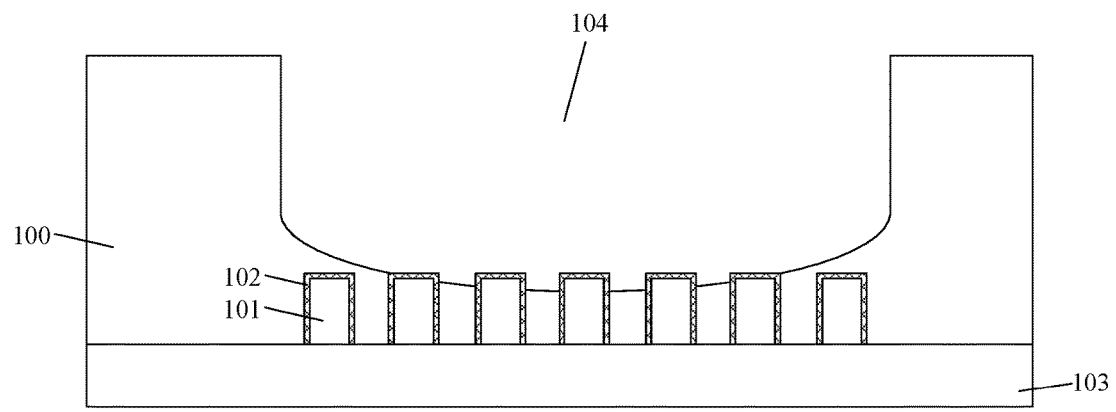
FIG. 1 illustrates a schematic view of an MEMS device formed by an existing method.

FIG. 1 shows an MEMS device fabricated by an existing method. Referring to FIG. 1, at the beginning of the fabrication process, a first substrate 100 is provided. The first substrate 100 has a front side and, opposite to the front side, a back side. A pattern is formed on the front side of the first substrate 100, and a plurality of openings 101 is then formed in the first substrate 100 from the front side of the first substrate 100 towards the back side of the first substrate 100. All the openings 101 formed in the first substrate 100 may have a same depth. A photosensitive layer 102 is formed on the bottom surfaces and the sidewall surfaces of the plurality of openings 101. The front side of the first substrate 100 is then bonded to a surface of a second substrate 103. After bonding, a patterned mask layer (not shown) is formed on the back side of the first substrate 100. A trench 104 is then formed in the first substrate 100 by etching the first substrate 100 using the patterned mask layer as an etch mask. The trench 104 exposes the portion of the photosensitive layer 102 formed on the bottom surfaces of the openings 101.

However, the trench 104 formed by the method described above often has a concave bottom surface towards the front side of the first substrate 100. Therefore, the trench 104 formed in the first substrate 100 may not be able to expose the portion of the photosensitive layer 102 formed on the bottom surfaces of all the openings 101.

Further, the trench 104 is often formed by a dry etching process, which may be affected by an etch loading effect. Specifically, the etch loading effect may become more severe when the trench 104 has a relatively larger width, leading to a concave bottom surface of the trench 104. That is, the center portion of the bottom surface of the trench 104 may be closer to the front side of the first substrate 100 as compared to the peripheral portion of the bottom surface of the trench 104. Therefore, during the dry etching process, when a portion of the photosensitive layer 102 near the deepest region of the concave bottom surface of the trench 104 (i.e., the center portion of the bottom surface) is exposed, another portion of the photosensitive layer 102 formed on the bottom surfaces of the openings near the sidewall surface of the trench 104 (i.e., the peripheral portion of the bottom surface) may still not be exposed.

During the dry etching process to form the trench 104, the etch loading effect may affect the uniformity of etching. Specifically, the material underneath the mask layer does not need to be etched. As the depth of the trench 104 becomes larger, the etching gas may be scattered off from the sidewall surface of the trench 104 and diffuse to the center of the trench 104. Therefore, the highest flow rate of the etching gas in the trench 104 may be at the center, which may further lead to a concave bottom surface for the ultimately-formed trench 104. Specifically, the center portion of the bottom surface of the trench 104 may be closer to the front side of the first substrate 100 as compared to the peripheral portion of the bottom surface of the trench 104. As such, the depth of the bottom surface of the trench 104 may be varied in the first substrate 100 and, thus, the photosensitive layer 102 formed on the bottom surfaces of all the openings 101 may not be completely exposed.

Figure 21:
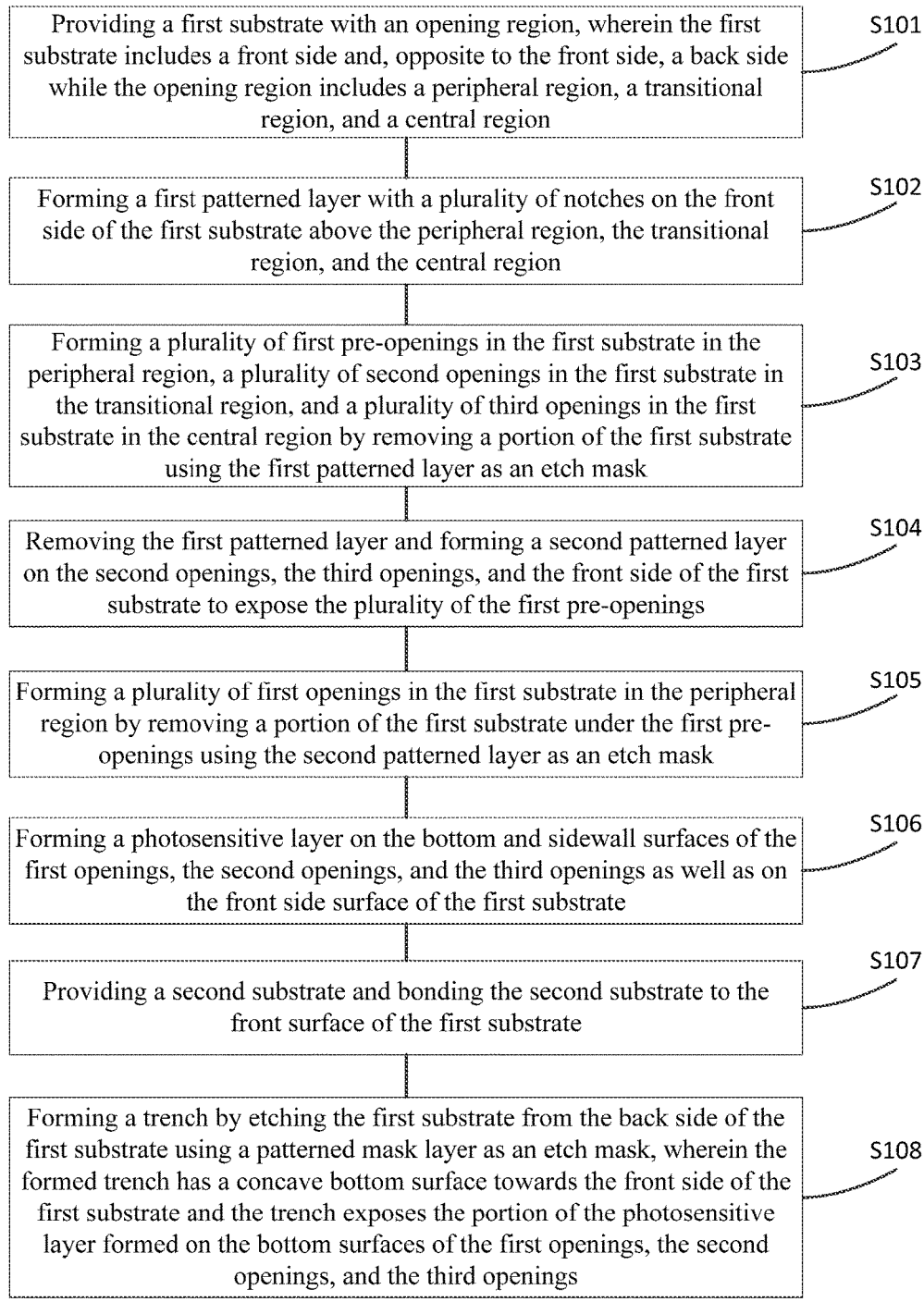
FIG. 21 illustrates a flowchart of an exemplary fabrication process consistent with disclosed embodiments.

In view of the above problems, the present disclosure provides a fabrication method to at least avoid the problems caused by the etch loading effect during the dry etching process. FIG. 21 shows a flowchart of an exemplary fabrication process consistent with disclosed embodiments.

Figure 2:
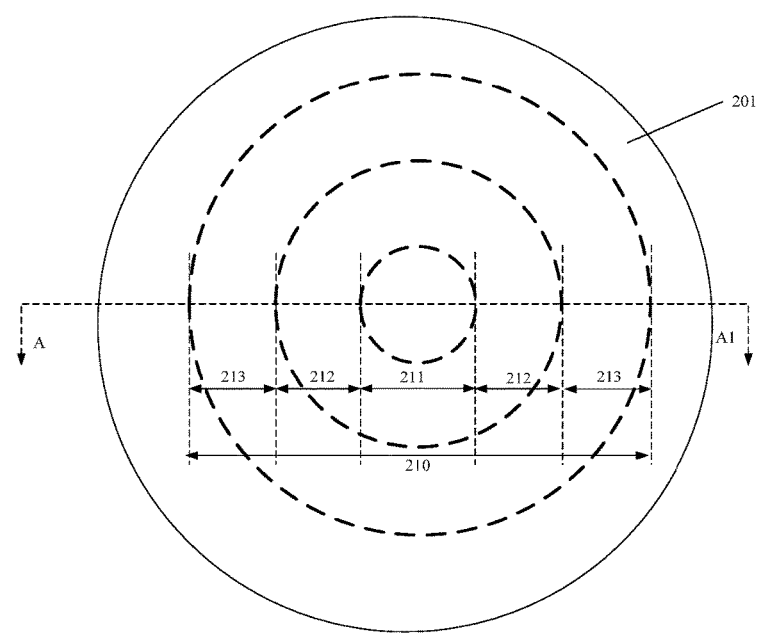
FIGS. 2-13 illustrate schematic views of semiconductor structures corresponding to certain stages of an exemplary fabrication method for MEMS devices consistent with disclosed embodiments.

Referring to FIG. 21, at the beginning of the fabrication process, a first substrate with an open region is provided (S101). FIG. 2 shows a schematic top-view of the corresponding structure and FIG. 3 shows a cross-section view of the structure shown in FIG. 2 along the AA1 line.

Figure 3:
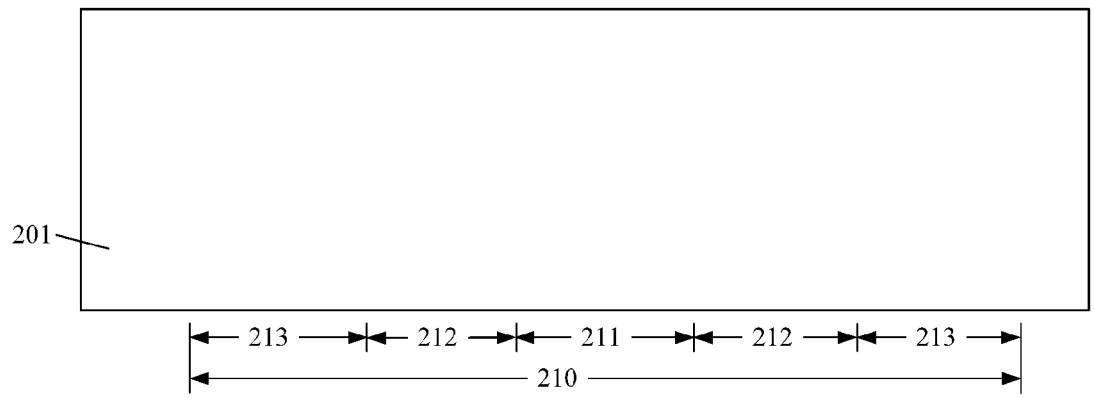

Referring to FIG. 2 and FIG. 3, a first substrate 201 with an open region 210 is provided. The first substrate 201 includes a front side and, opposite to the front side, a back side. The open region 210 may include a central region 211, a transitional region 212 surrounding the central region 211, and a peripheral region 213 surrounding the transitional region 212.

The first substrate 201 may be made of Si, Ge, SiGe, SiC, or GaAs. Alternatively, the first substrate 201 may also be made of silicon on insulator, germanium on insulator, or SiGe on insulator.

In one embodiment, the first substrate 201 is made of Si. Further, electronic devices such as NMOS transistors, PMOS transistors, CMOS transistors, resistors, capacitors, inductors, interconnection structures, etc. may also be formed in the first substrate 201.

In subsequent processes, a plurality of discreet openings may be formed in the open region 210 of the first substrate 201 and a trench may then be formed on the back side of the first substrate by etching.

Specifically, openings formed in the first substrate 201 in the peripheral region 213 may be the first openings; openings formed in the first substrate 201 in the transitional region 212 may be the second openings; and openings formed in the first substrate 201 in the central region 211 may be the third openings. Among all the openings formed in the first substrate 201, the first openings may have the largest depth in the first substrate 201. In addition, the distance from the first openings to the sidewall of the trench may be the shortest while the distance from the third openings to the sidewall of the trench may be the largest.

The peripheral region 213 may be a circular ring, an elliptical ring, a polygonal ring, or an irregular closed ring. The transitional region 212 may be a circular ring, an elliptical ring, a polygonal ring, or an irregular closed ring. The central region 211 may also be a circular ring, an elliptical ring, a polygonal ring, or an irregular closed ring. When the shape of the peripheral region 213, the transitional region 212, or the central region 211 is a polygonal ring, the number of the edges of the polygonal ring may be greater than or equal to 3. In one embodiment, the central axes of the open region 210, the peripheral region 213, the transitional region 212, and the central region 211 overlap with each other so that the central axis of the trench formed by etching the first substrate 201 from the back side of the first substrate 201 may also overlap with the central axis of the central region 211.

For illustration purpose, the first substrate 201 is described to have a circular shape. The peripheral region 213 is a circular ring, the transitional region 212 is a circular ring, and the central region 211 is also a circular ring. In other embodiments, the first substrate 201, the peripheral region 213, the transitional region 212, and the central region 211 may have any other appropriate shapes.

Figure 4:
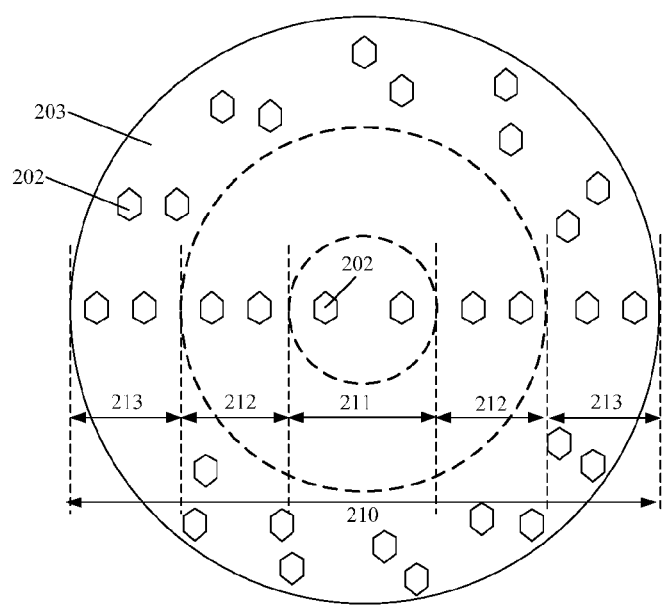
Figure 5:
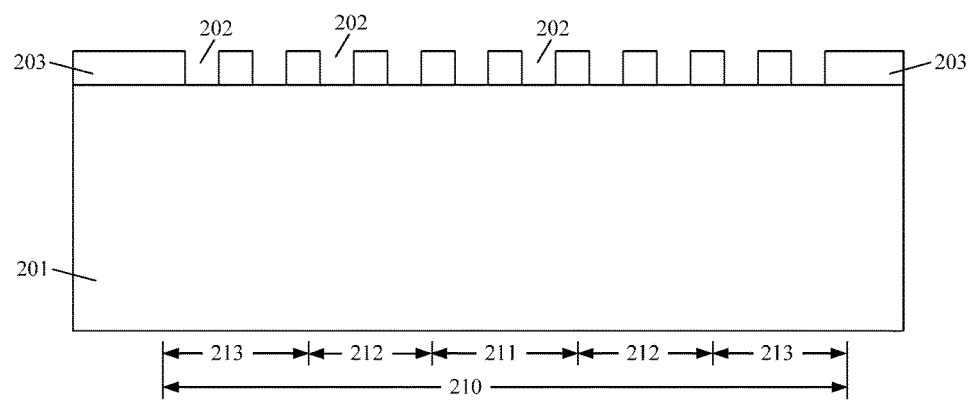

Further, returning to FIG. 21, a first patterned layer with a plurality of notches may be formed on the front side of the first substrate (S102). FIG. 4 shows a schematic top-view of the open region after the formation of the plurality of notches in the first patterned layer. FIG. 5 shows a schematic cross-section view of the structure having the first patterned layer and the plurality of notches formed based on the structure shown in FIG. 3.

Referring to FIG. 4 and FIG. 5, a first patterned layer 203 may be formed on the front side of the first substrate 201. A plurality of notches 202 may then be formed in the first patterned layer 203.

The plurality of notches 202 may be formed in the peripheral region 213, the transitional region 212, and the central region 211. In addition, along a direction parallel to the front side of the first substrate 201, the dimensions of the notches 202 formed in the peripheral region 213, the transitional region 212, and the central region 211 may all be the same. Therefore, the dimensions of subsequently-formed first openings, second openings, and third openings may also be the same along the direction parallel to the front side of the first substrate 201.

The positions and the numbers of the notches 202 formed in the peripheral region 213, above the transitional region 212, and above the central region 211 may be decided based on actual needs. The top-view of each notch 202 may have a circular, elliptical, or polygonal shape. In one embodiment, the top-view of each notch 202 is hexagonal.

The first patterned layer 203 may be made of a hard mask material or a photoresist material. In one embodiment, the first patterned layer 203 is made of a photoresist material. The first patterned layer 203 may be formed by a process including coating a photoresist film on the front side of the first substrate 201 and then performing an exposure and development process on the photoresist film to form the first patterned layer 203 with the plurality of notches 202 on the front side of the first substrate 201.

In one embodiment, schematic structural views for subsequent processes (i.e., FIGS. 6-13) may be all based on the structure shown in FIG. 5.

Figure 6:
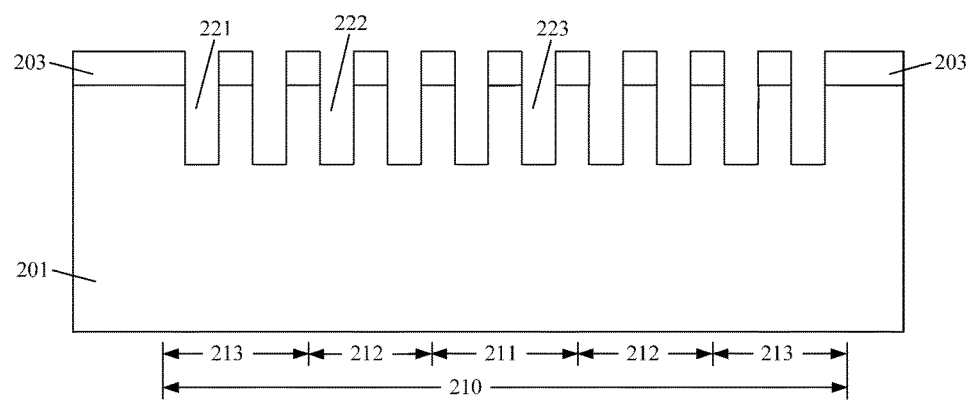

Further, returning to FIG. 21, by using the first patterned layer as an etch mask, a portion of the first substrate may be etched from the front side towards the back side of the first substrate to form a plurality of first pre-openings in the first substrate in the peripheral region, a plurality of second pre-openings in the first substrate in the transitional region, and a plurality of third pre-openings in the first substrate in the central region (S103). FIG. 6 shows a corresponding semiconductor substrate.

Referring to FIG. 6, the first substrate 201 may be etched from the front side towards the back side of the first substrate 201 by using the first patterned layer 203 as an etch mask. As a portion of the first substrate 201 is removed by etching, a plurality of first pre-openings 221 may be formed in the first substrate in the peripheral region 213, a plurality of second openings 222 may be formed in the first substrate in the transitional region 212, and a plurality of third openings 223 may be formed in the first substrate in the central region 211.

The portion of the first substrate 201 may be removed by a dry etching process. The first pre-openings 221, the second openings 222, and the third openings 223 may have a same depth. Therefore, the depth of the second openings 222 in the first substrate 201 may be equal to the depth of the third openings 223 in the first substrate 201.

The shape of the top-view of the second openings 222 may be the same as the shape of the top-view of the notches 202 in the transitional region 212. The shape of the top-view of the third openings 223 may be the same as the shape of the top-view of the notches 202 in the central region 211. The shape of the top-view of the first pre-openings 221 may be the same as the shape of the top-view of the peripheral region 213.

Figure 7:
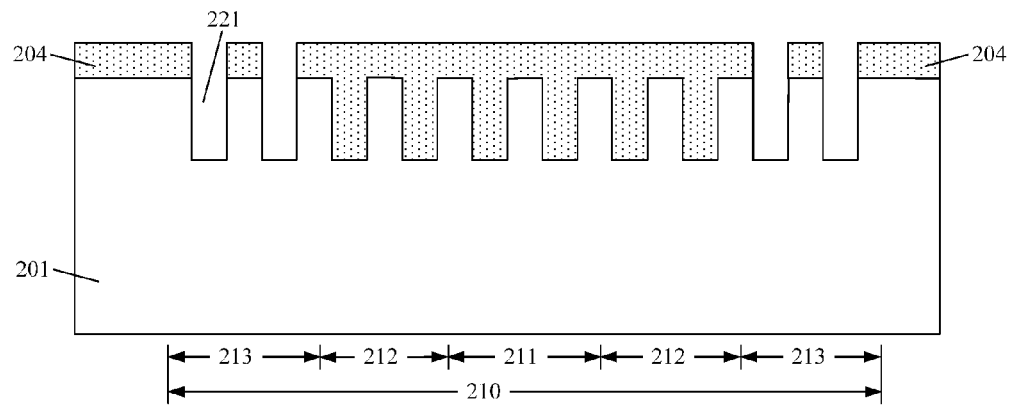

Further, returning to FIG. 21, the first patterned layer may be removed and a second patterned layer exposing the first pre-openings may be formed to cover the second openings, the third openings, and the front side of the first substrate (S104). FIG. 7 shows a schematic cross-section view of the corresponding structure.

Referring to FIG. 7, the first patterned layer 203 (referring to FIG. 6) may be removed. A second patterned layer 204 may be formed on the front side of the first substrate 201 to cover the second openings 222 (referring to FIG. 6), the third openings 223 (referring to FIG. 6), and the front side of the first substrate 201. The second patterned layer 204 may expose the plurality of first pre-openings 221.

The first patterned layer 203 may be removed by an ashing process or a wet etching strip-removal process. The second patterned layer 204 may be made of a hard mask material or a photoresist material. In one embodiment, the second patterned layer 204 is made of a photoresist material.

The second patterned layer 204 may be used as an etch mask during a subsequent etching process to remove a portion of the first substrate 201 under the first pre-openings 221 and thus form a plurality of first openings in the first substrate 201 of the peripheral region 213. As such, the depth of the first openings in the first substrate 201 may be larger than the depth of the third openings 223 in the first substrate 201.

Figure 8:
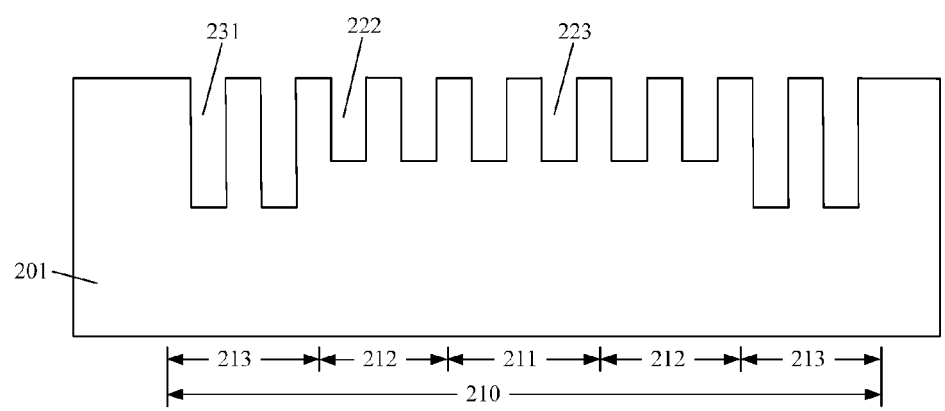

Returning to FIG. 21, a plurality of first openings may be formed in the first substrate in the peripheral region by removing a portion of the first substrate under the first pre-openings (S105). FIG. 8 shows a schematic cross-section view of the corresponding structure.

Referring to FIG. 8, a plurality of first openings 231 may be formed in the first substrate 201 of the peripheral region 213 by etching a portion of the first substrate 201 under the first pre-openings using the second patterned layer 204 (referring to FIG. 7) as an etch mask.

In one embodiment, the depth of the first openings 231 in the first substrate 201 may be larger than the depth of the third openings 223 in the first substrate 201, while the depth of the second openings 222 in the first substrate 201 may be the same as the depth of the third openings 223 in the first substrate 201. The first openings 231, the second openings 222, and the third openings 223 may have a same dimension along the direction parallel to the front side of the first substrate 201.

After forming the first openings 231, the second patterned layer 204 may be removed. The second patterned layer 204 may be removed by an ashing process or a wet etching strip-removal process.

Figure 9:
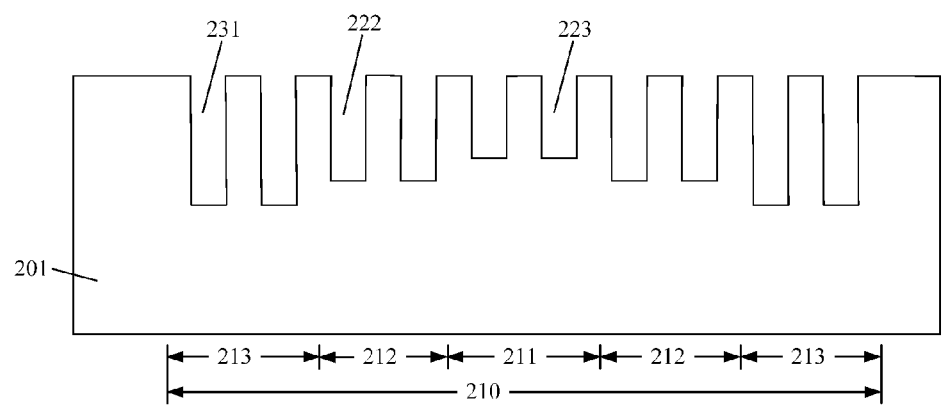

In certain other embodiments, referring to FIG. 9, the depth of the second openings 222 in the first substrate 201 may be larger than the depth of the third openings 223 in the first substrate 201. The depth of the second openings 222 in the first substrate 201 may be larger than, equal to, or smaller than the depth of the first openings 231 in the first substrate 201 as long as the depth of the second openings 222 in the first substrate 201 is not smaller than the depth of the third openings 223 in the first substrate 201. Along a direction from the peripheral region 213 to the central region 211, the second openings 222 formed in the transitional region 212 may all have a same depth in the first substrate 201.

Figure 10:
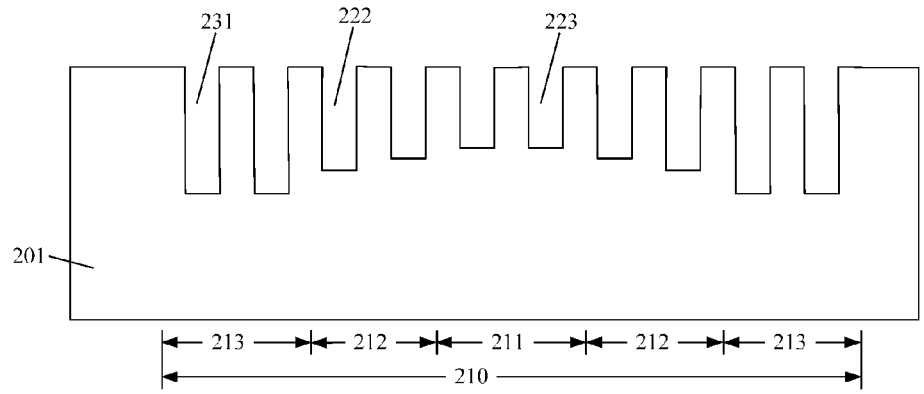

Alternatively, referring to FIG. 10, the depth of each second opening 222 in the first substrate 201 may always be larger than the depth of the third openings 223 in the first substrate 201. However, the depth of one second opening 222 in the first substrate 201 may become smaller in the first substrate 201 along the direction from the peripheral region 213 to the central region 211.

For example, in one embodiment, the depth of the second openings may be larger than the depth of the third openings and the depth of the first openings may be larger than the depth of the second openings. Specifically, the above-mentioned first openings, second openings, and third openings may be formed by a process including the following steps.

First, a first patterned layer with a plurality of notches may be formed on the front side of the first substrate. The notches formed in the peripheral region, the transitional region, and the central region may all have a same dimension along the direction parallel to the front side of the first substrate. Then, a portion of the first substrate may be removed by an etching process using the first patterned layer as an etch mask to form a plurality of first pre-openings in the first substrate in the peripheral region, a plurality of second pre-openings in the first substrate in the transitional region, and a plurality of third openings in the first substrate in the central region. The first patterned layer may then be removed.

Further, a second patterned layer exposing the first pre-openings and the second pre-openings may be formed on the third openings and the front side of the first substrate. An etching process using the second patterned layer as an etch mask may be performed to remove a portion of the first substrate under the second pre-openings and thus form a plurality of second openings. In the meantime, a portion of the first substrate under the first pre-openings may also be removed. The second patterned layer may then be removed.

Moreover, a third patterned layer may be formed on the second openings, the third openings, and the front side of the first substrate. The third patterned layer may expose the first pre-openings. An etching process using the third patterned layer as an etch mask may be performed to remove a portion of the first pre-openings and thus form a plurality of first openings. As such, the depth of the first openings in the first substrate may be the largest; the depth of the second openings in the first substrate may be the second largest; while the depth of the third openings in the first substrate may be the smallest.

In another embodiment, the depth of the second openings in the first substrate may be equal to the depth of the first openings in the first substrate. Accordingly, during the formation of the third openings in the first substrate, a plurality of first pre-openings may be formed in the first substrate in the peripheral region while a plurality of second pre-openings may be formed in the first substrate in the transitional region. Further, a second patterned layer may be formed on the third openings and the front side of the first substrate to expose the first pre-openings and the second pre-openings.

Then, an etching process may be performed by using the second patterned layer as an etch mask to remove a portion of the first substrate under the first pre-openings and thus form a plurality of first openings in the first substrate in the peripheral region. In the meantime, a portion of the first substrate under the second pre-openings may also be removed to form a plurality of second openings in the first substrate in the transitional region. As such, the depth of the first openings may be the same as the depth of the second openings.

Figure 11:
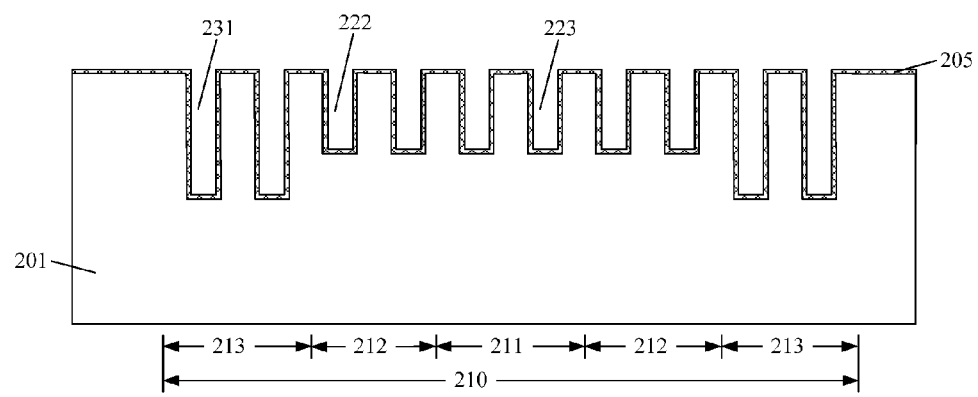

Further, returning to FIG. 21, a photosensitive layer may be formed on the bottom surfaces and sidewall surfaces of the first openings, the second openings, and the third openings (S106). FIG. 11 shows a schematic cross-section view of the corresponding structure.

Referring to FIG. 11, a photosensitive layer 205 may be formed on the bottom and the sidewall surfaces of the first openings 231, the second openings 222, as well as the third openings 223.

In one embodiment, the photosensitive layer 205 may be made of $SiO_x$. The photosensitive layer 205 may also be formed on the front side of the first substrate 201. The photosensitive layer 205 may not completely fill any opening of the first openings 231, the second openings 222, and the third openings 223. That is, the photosensitive layer 205 may only partially fill each of the first openings 231, the second openings 222, and the third openings 223.

The photosensitive layer 205 may be formed by a chemical vapor deposition process, an atomic layer deposition process, or a physical vapor deposition process. In one embodiment, the photosensitive layer 205 is formed by a thermal oxidation process. The thickness of the photosensitive layer 205 may be in a range of 10 Å to 100 Å.

Figure 12:
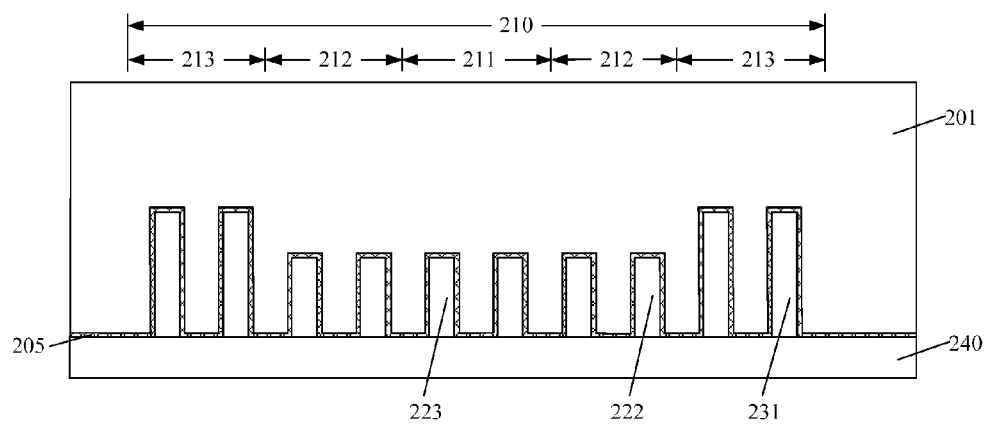

Returning to FIG. 21, further, a second substrate may be provided and bonded to the first substrate (S107). FIG. 12 shows a schematic cross-section view of the corresponding structure.

Referring to FIG. 12, a second substrate 240 may be provided. The second substrate 240 may then be bonded to the front side of the first substrate 201. The second substrate 240 may provide support for the first substrate 201. Further, electronic devices such as PMOS transistors, NMOS transistors, CMOS transistors, resistors, inductors, capacitors, interconnection structures, etc. may be formed on the second substrate 240.

The second substrate 240 may be made of Si, Ge, SiGe, SiC, or GaAs. The second substrate 240 may also be made of silicon on insulator, germanium on insulator, or SiGe on insulator. Alternatively, a glass substrate or a PCB substrate may also be used as the second substrate. In one embodiment, the second substrate 240 is a silicon substrate. A vacuum bonding process may be used to bond the first substrate 201 and the second substrate 240. After the vacuum bonding process, the environment in each of the first openings 231, the second openings 222, and the third openings 223 may be close to a vacuum.

Figure 13:
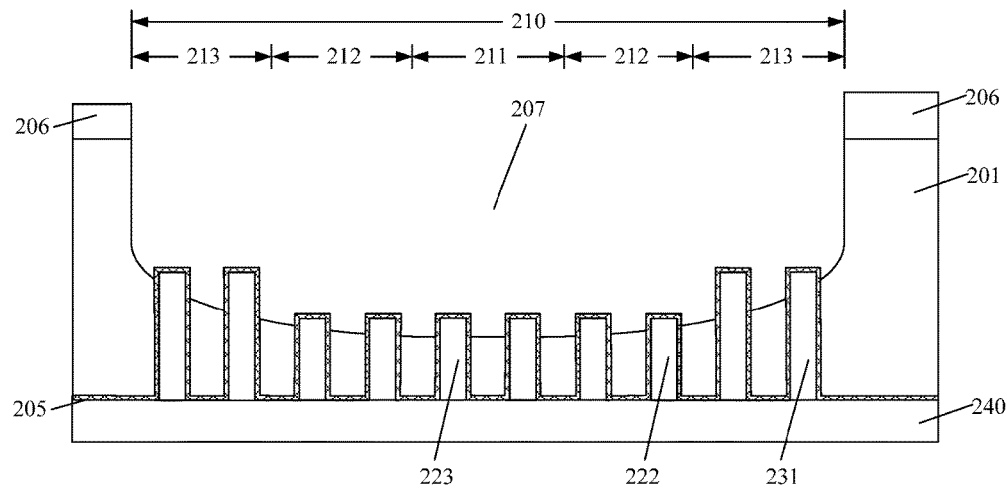

Further, returning to FIG. 21, a trench with a concave bottom surface towards the front side of the first substrate may be formed by etching the back side of the first substrate (S108). FIG. 13 shows a schematic cross-section view of the corresponding structure.

Referring to FIG. 13, after the bonding process, a patterned mask layer 206 may be formed on the back side of the first substrate 201. A trench 207 with a concave bottom surface towards the front side of the first substrate 201 may be formed by a dry etching process using the patterned mask layer 206 as an etch mask to etch the first substrate 201 along a direction from the back side to the front side of the first substrate 201.

The patterned mask layer 206 may expose a portion of the back side surface of the first substrate 201 corresponding to the open region 210. In one embodiment, the patterned mask layer 206 is made of photoresist.

After forming the trench 207, the portion of the photosensitive layer 205 formed on the bottom surfaces of the first openings 231, the second openings 222, and the third openings 223 may all be exposed. In addition, the central axis of the trench 207 may overlap with the central axis of the open region 210.

Because of the etch loading effect during the dry etching process, the bottom surface of the trench 207 formed by the dry etching process may have a concave shape towards the front side of the first substrate 201. Specifically, referring to FIG. 13, the lowest point of the bottom surface of the trench 207 may be in the central region 211 while the sidewall of the trench 207 may be close to the peripheral region 213. In addition, because the central axis of the trench 207 may overlap with the central axis of the open region 210, the point at which the central axis of the trench 207 intersects the bottom surface of the trench 207 may be the lowest point of the bottom surface of the trench 207. The lowest point of the bottom surface of the trench 207 may be in the central region 211.

In one embodiment, the depth of the first openings 231 in the first substrate 201 is larger than the depth of the third openings 223 in the first substrate 201. That is, the first openings 231 formed near the sidewall of the trench 207 may be deeper than the third openings 223 formed near the center of the trench 207. Therefore, although the trench 207 may have a concave bottom surface towards the front side of the first substrate 201, a portion of the photosensitive layer 205 formed on the bottom surfaces of the first openings 231 may still be exposed after the dry etching process. Further, because the depth of the second openings 222 in the first substrate 201 may be equal to or larger than the depth of the third openings 223 in the first substrate 201, a portion of the photosensitive layer 205 formed on the bottom surfaces of the second openings 222 may also be exposed.

Because the portion of the photosensitive layer 205 formed on the bottom surfaces of the first openings 231, the second openings 222, and the third openings 223 may all be exposed, the sensitivity of the MEMS device on light may be enhanced and, thus, the electronic performance of the MEMS device may be improved.

In certain other embodiments, the open region of the first substrate may only include a central region and a peripheral region surrounding the central region. Accordingly, a plurality of first openings may be formed in the first substrate in the peripheral region and a plurality of third openings may be formed in the first substrate in the central region. The depth of the first openings in the first substrate may be larger than the depth of the third openings in the first substrate. The dimension of the first openings may be the same as the dimension of the third openings along the direction parallel to the front side of the first substrate.

After forming the trench 207, the patterned mask layer 206 may be removed by an ashing process or a wet etching strip-removal process.

Further, corresponding to the fabrication method described above, the present disclosure also provides an MEMS device. Referring to FIG. 13, the MEMS device may include a first substrate 201 with an open region 210. The first substrate may further include a front side and, opposite to the front side, a back side. The open region 210 may include a central region 211, a transitional region 212 surrounding the central region 211, and a peripheral region 213 surrounding the transitional region 212.

The MEMS device may also include a plurality of first openings 231 formed in the first substrate 201 of the peripheral region 213, a plurality of second openings 222 formed in the first substrate 201 of the transitional region 212, and a plurality of third openings 223 formed in the first substrate 201 of the central region 211. The depths of the first openings 231, the second openings 222, and the third openings 223 may all be below the thickness of the first substrate 201.

The MEMS device may include a photosensitive layer 205 formed on the bottom and the sidewall surfaces of the first openings 231, the second openings 222, and the third openings 223. The MEMS device may further include a second substrate 240 which is bonded to the front side of the first substrate 201.

Further, the MEMS device may include a trench 207 formed on the opposite side of the open region 210 of the first substrate 201. That is, the MEMS device may include a trench formed on the back side of the first substrate 201. The bottom of the trench 207 may have a concave shape towards the front side of the first substrate 201. The trench 207 may expose a portion of the photosensitive layer 205 formed on the bottom surfaces of the first openings 231, the second openings 222, and the third openings 223.

A detailed description of the MEMS devices is provided as follows.

The first substrate 201 may be made of Si, Ge, SiGe, SiC, or GaAs. The first substrate 201 may also be made of silicon on insulator, germanium on insulator, or SiGe on insulator. Further, a plurality of electronic devices such as NMOS transistors, PMOS transistors, CMOS transistors, resistors, capacitors, inductors, and interconnection structures may also be formed in the first substrate 201.

The peripheral region 213 may be a circular ring, an elliptical ring, a polygonal ring, or an irregular closed ring. The transitional region 212 may be a circular ring, an elliptical ring, a polygonal ring, or an irregular closed ring. The central region 211 may also be a circular ring, an elliptical ring, a polygonal ring, or an irregular closed ring. When the shape of the peripheral region 213, the transitional region 212, or the central region 213 is polygonal, the number of the edges of the polygonal ring may be greater than or equal to 3. In one embodiment, the central axes of the open region 210, the peripheral region 213, the transitional region 212, and the central region 211 match with each other so that the central axis of the trench formed by etching the first substrate 201 from the back side of the first substrate 201 may overlap with the central axis of the central region 211.

In one embodiment, the first openings 231, the second openings 222, and the third openings 223 may have a same dimension along the direction parallel to the front side of the first substrate 201. The depth of the second openings 222 in the first substrate 201 may be larger than or equal to the depth of the third openings 223 in the first substrate 201. The depth of the second openings 222 in the first substrate 201 may be larger than, equal to, or smaller than the depth of the first openings 231 in the first substrate 201.

In one embodiment, the second openings 222 formed in the first substrate 201 of the transitional region 212 may all have a same depth in the first substrate 201. In certain other embodiments, different second openings 222 may have different depths and the depths of different second openings 222 formed in the first substrate 201 may become smaller and smaller in the transitional region 212 along the direction from the peripheral region 213 to the central region 211.

The second substrate 240 may provide support for the first substrate 201. Further, devices such as PMOS transistors, NMOS transistors, CMOS transistors, resistors, inductors, capacitors, interconnection structures, etc. may be formed on the second substrate 240.

The second substrate 240 may be made of Si, Ge, SiGe, SiC, or GaAs. The second substrate 240 may also be made of silicon on insulator, germanium on insulator, or SiGe on insulator. Alternatively, a glass substrate or a PCB substrate may also be used as the second substrate.

The photosensitive layer 205 may be made of $SiO_x$. In one embodiment, the central axis of the trench 207 may overlap with the central axis of the central region 211, thus the lowest point of the bottom surface of the trench 207 may be in the central region 211.

The exposed portion of the photosensitive layer 205 may be used to sense external light. In one embodiment, because the portion of the photosensitive layer 205 formed on the bottom surfaces of the first openings 231, the second openings 222, and the third openings 223 may be exposed, the ability of the MEMS device to sense light may be enhanced and, thus, the electronic performance of the MEMS device may be improved.

Figure 22:
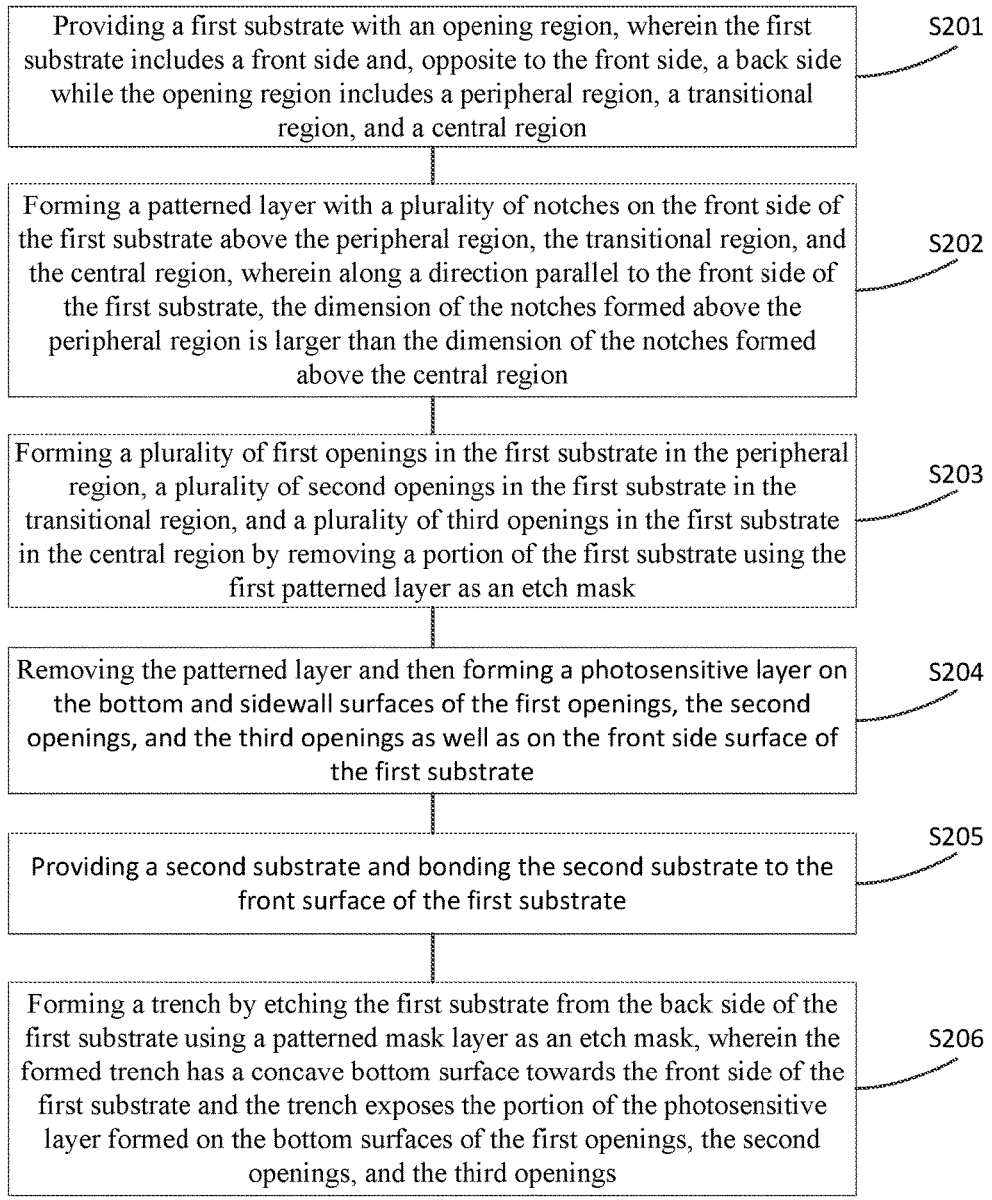
FIG. 22 illustrates a flowchart of an exemplary fabrication process consistent with disclosed embodiments.

FIG. 22 shows a flowchart of another exemplary fabrication process consistent with disclosed embodiments. Specifically, in one embodiment, the dimension of the first openings is larger than the dimension of the third openings along a direction parallel to the front side of the first substrate. FIGS. 14-20 show schematic views of semiconductor structures corresponding to certain stages of the fabrication method.

Figure 14:
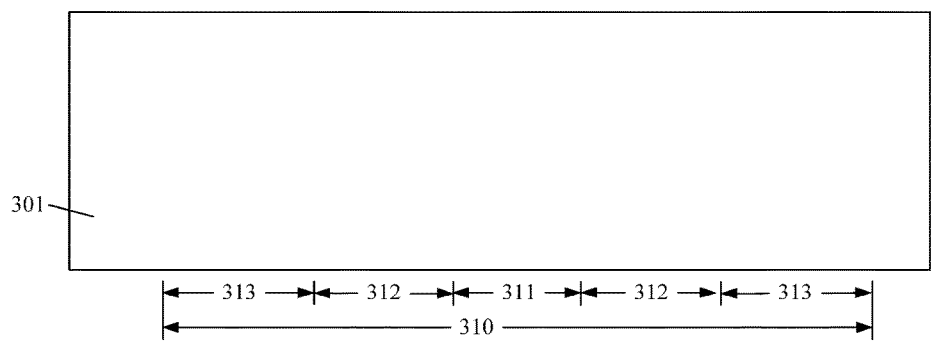
FIGS. 14-20 illustrate schematic views of semiconductor structures corresponding to certain stages of an exemplary fabrication method for MEMS devices consistent with disclosed embodiments.

Referring to FIG. 22, at the beginning of the fabrication process, a first substrate with an open region is provided (S201). FIG. 14 shows a schematic cross-section view of the corresponding structure.

Referring to FIG. 14, a first substrate 301 with an open region 310 may be provided. The open region 310 may further include a central region 311, a transitional region 312 surrounding the central region 311, and a peripheral region 313 surrounding the transitional region 312. For a detailed description of the first substrate 301, one may refer to the afore-mentioned embodiments.

Subsequently, a plurality of third openings may be formed in the first substrate 301 of the central region 311, a plurality of second openings may be formed in the first substrate 301 of the transitional region 312, while a plurality of third openings may be formed in the first substrate 301 of the peripheral region 313. Along a direction parallel to the front side of the first substrate 301, the dimension of the first openings may be larger than the dimension of the third openings while the dimension of the second openings may be larger than or equal to the dimension of the third openings. In addition, the depth of the first openings in the first substrate 301 may be larger than the depth of the third openings in the first substrate 301 while the depth of the second openings in the first substrate may be larger than or equal to the depth of the third openings in the first substrate 301.

Figure 15:
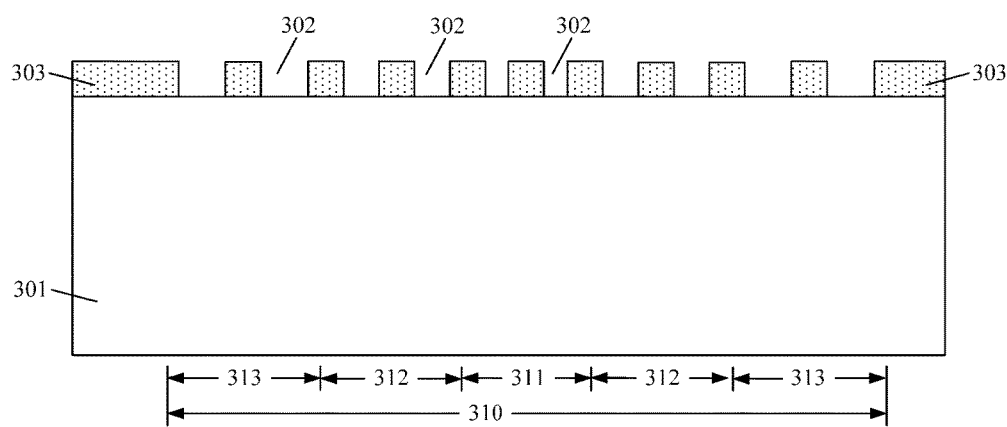

Returning to FIG. 22, further, a patterned layer with a plurality of notches may be formed on the front side of the first substrate (S202). FIG. 15 shows a schematic cross-section view of the corresponding structure.

Referring to FIG. 15, a patterned layer 303 may be formed on the front side of the first substrate 301. A plurality of notches 302 may be formed in the patterned layer 303 to expose a portion of the front side surface of the first substrate 301.

In one embodiment, the dimension of the notches 302 formed in the peripheral region 313 along the direction parallel to the front side of the first substrate 301 is larger than the dimension of the notches 302 formed in the central region 311 along the direction parallel to the front side of the first substrate 301.

Thus, for notches 302 with a larger dimension along the direction parallel to the front side of the first substrate 301, when a subsequent etching process is performed to etch the first substrate 301 along the notches 302, more etching gas may come to contact with the first substrate 301 below the notches 302. Therefore, the etching rate on the first substrate 302 below the notches 302 with a larger dimension may also be larger.

Because the dimension of the notches 302 formed in the peripheral region 313 is larger than the dimension of the notches 302 formed in the central region 311, the depth of the first openings formed in the first substrate 301 may then be larger than the depth of the third openings formed in the first substrate 301. In addition, because only a single fabrication step may be required to form such a patterned layer 303 to further ensure that the depth of the subsequently-formed first openings is larger than the depth of the third openings, the fabrication method may lower process cost, reduce process difficulty, and avoid the position deviation problem that may occur when multiple patterned layers are formed.

Further, the dimension of the notches 302 formed in the transitional region 312 along the direction parallel to the front side of the first substrate 301 may be larger than or equal to the dimension of the notches 302 formed in the central region 311 along the direction parallel to the front side of the first substrate 301. Thus, the depth of the subsequently-formed second openings may be larger than or equal to the depth of the subsequently-formed third openings.

The dimension of the notches 302 formed in transitional region 312 along the direction parallel to the front side of the first substrate 301 may be larger than, equal to, or smaller than the dimension of the notches 302 formed in the peripheral region 313 along the direction parallel to the front side of the first substrate 301, thus the depth of the subsequently-formed second openings may be larger than, equal to, or smaller than the depth of the subsequently-formed first openings.

Figure 16:
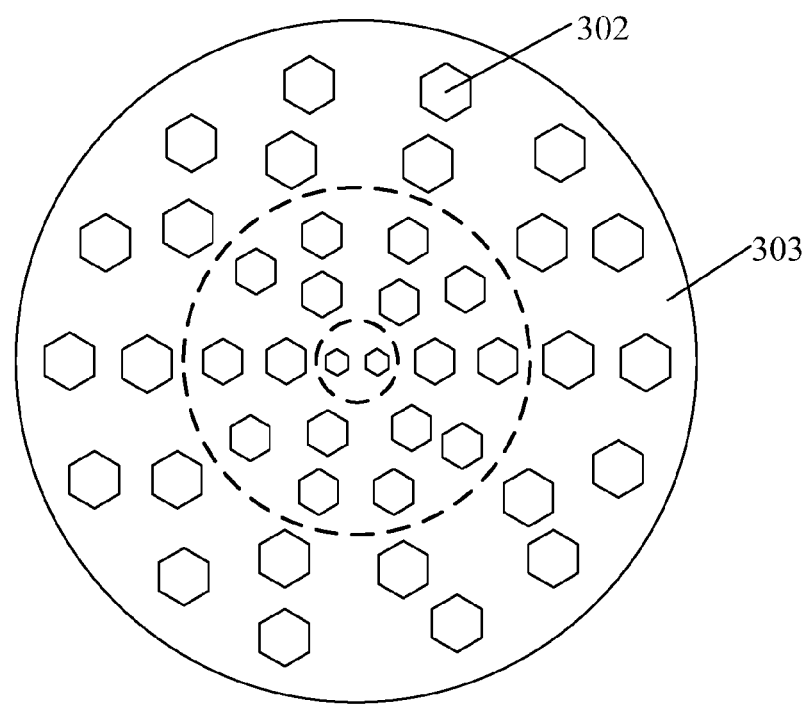

The positions and the numbers of the notches 302 formed in the peripheral region 313, the transitional region 312, and the central region 311 may be determined according to actual demands. The top-view of the notches 302 may have a circular, elliptical, or polygonal shape. In one embodiment, the shape of the top-view of the notches 302 is hexagonal. FIG. 16 shows a schematic top-view of the open region. The open region, the peripheral region, the transitional region, and the central region are not labeled in FIG. 16.

The patterned layer 303 may be made of a hard mask material or a photoresist material. In one embodiment, the patterned layer 303 is made of a photoresist material. The schematic structural views for subsequent processes (FIGS. 17-20) may be all based on the structure shown in FIG. 15.

Figure 17:
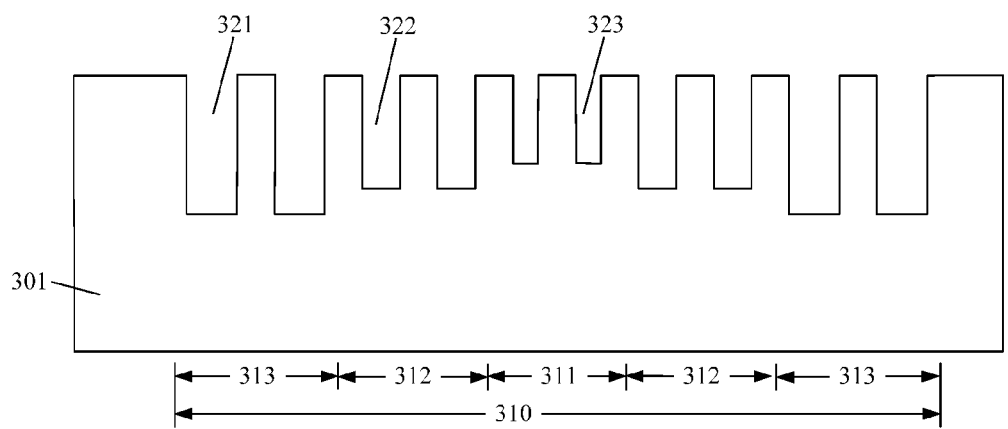

Further, returning to FIG. 22, a portion of the first substrate may be etched by using the patterned layer as an etch mask to form a plurality of first openings in the peripheral region, a plurality of second openings in the transitional region, and a plurality of third openings in the central region (S203). FIG. 17 shows a schematic cross-section view of the corresponding structure.

Referring to FIG. 17, an etching process using the patterned layer 303 (referring to FIG. 15) as an etch mask may be performed. A portion of the first substrate 301 may be removed by the etching process so that a plurality of first openings 321 may be formed in the first substrate 301 of the peripheral region 313, a plurality of second openings 322 may be formed in the first substrate 301 of the transitional region 312, and a plurality of third openings 323 may be formed in the first substrate 301 of the central region 311.

Along the direction parallel to the front side of the first substrate 301, the dimension of the first openings 321 may be larger than the dimension of the third openings 323 while the dimension of the second openings 322 may be larger than or equal to the dimension of the third openings 323.

In one embodiment, the dimension of the second openings 322 along the direction parallel to the front side of the first substrate 301 is larger than the dimension of the third openings 323 along the direction parallel to the front side of the first substrate 301. The second openings 322 may all have a same dimension along the direction parallel to the front side of the first substrate 301.

In certain other embodiments, different second openings 322 may have different dimensions along the direction parallel to the front side of the first substrate 301. Specifically, while the dimensions of the second opening 322 are all larger than the dimension of the third openings 323 along the direction parallel to the front side of the first substrate 301, the dimensions of the second openings 322 may become smaller and smaller in the transitional region 312 along a direction from the peripheral region 313 to the central region 311.

In one embodiment, the dimension of the first openings 321 along the direction parallel to the front side of the first substrate 301 is in a range of 50 μm to 80 μm while the dimension of the third openings 323 along the direction parallel to the front side of the first substrate 301 is in a range of 30 μm to 50 μm.

The portion of the first substrate 301 may be removed by a dry etching process in order to form the first openings 321, the second openings 322, and the third openings 323. Specifically, during the dry etching process, more etching gas may come to contact with the portion of the first substrate 301 below the notches 302 with a larger dimension along the direction parallel to the front side of the first substrate 301. Therefore, the etching rate on the first substrate 302 below the notches 302 with a larger dimension may also be larger.

Because the dimension of the notches 302 formed in the peripheral region 313 is larger than the dimension of the notches 302 formed in the central region 311, the depth of the first openings 321 formed in the first substrate 301 may then be larger than the depth of the third openings 323 formed in the first substrate 301. In addition, the depth of the second openings 322 in the first substrate 301 may be larger than or equal to the depth of the third openings 323 in the first substrate 301. The depth of the second openings 322 in the first substrate 301 may be larger than, equal to, or smaller than the depth of the first openings 321 in the first substrate 301.

In one embodiment, the depth of the second openings 322 in the first substrate 301 is larger than the depth of the third openings 323 in the first substrate 301, and the second openings 322 in the transitional region 312 may all have a same depth in the first substrate 301. In certain other embodiments, different second openings 322 in the transitional region 312 may have different depths in the first substrate 301 and the depths of different second openings may become smaller and smaller along the direction from the peripheral region 312 to the central region 311.

The dimensions of the notches 302 formed in the patterned layer 303 may be pre-determined to ensure the depth of the subsequently-formed first openings 321 in the first substrate 301 larger than the depth of the third openings 323 in the first substrate 301. Thus, only a patterning process and an etching process may be required to form desired first openings 321, second openings 322, and third openings 323.

Therefore, the disclosed method may simplify fabrication process, reduce process difficulty, and avoid problems due to alignment error when forming multiple patterned layers. Further, the method may also prevent an ultimately-formed MEMS device from having an unexposed portion of a subsequently-formed photosensitive layer on the bottom surfaces of the first openings 321, the second openings 322, and/or the third openings 323.

After forming the first openings 321, the second openings 322, and the third openings 323, the patterned layer 303 may be removed. The patterned layer 303 may be removed by an ashing process or a wet etching strip-removal process.

Figure 18:
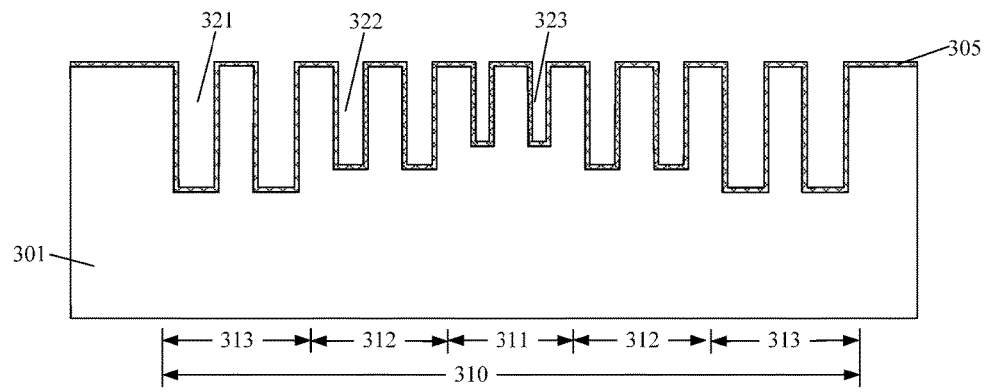

Further, returning to FIG. 22, a photosensitive layer may be formed on the bottom and the sidewall surfaces of the first openings, the second openings, and the third openings (S204). FIG. 18 shows a schematic cross-section view of the corresponding structure.

Referring to FIG. 18, a photosensitive layer 305 may be formed on the bottom and the sidewall surfaces of the first openings 321, the second openings 322, and the third openings 323.

In one embodiment, the photosensitive layer 305 is made of $SiO_x$. The photosensitive layer 305 may also be formed on the front side of the first substrate 301. The photosensitive layer 305 must not completely fill any opening of the first openings 321, the second openings 322, and the third openings 323. That is, the photosensitive layer 305 may only partially fill each of the first openings 321, the second openings 322, and the third openings 323.

The photosensitive layer 305 may be formed by a chemical vapor deposition, an atomic layer deposition, or a physical vapor deposition process. In one embodiment, the photosensitive layer 305 is formed by a thermal oxidation process. The thickness of the photosensitive layer 305 may be in a range of 10 Å to 100 Å.

Figure 19:
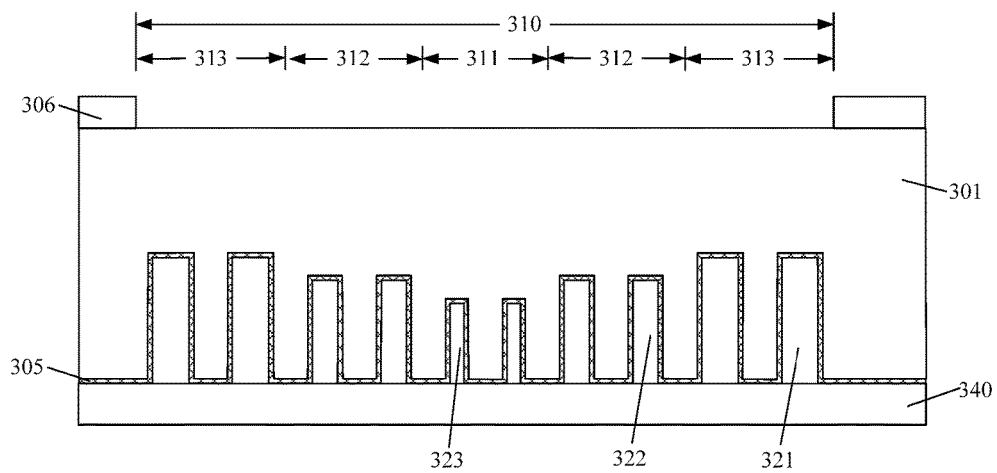

Further, returning to FIG. 22, a second substrate may be bonded to the front side of the first substrate and a patterned mask layer may be formed on the back side of the first substrate (S205). FIG. 19 shows a schematic cross-section view of the corresponding structure.

Referring to FIG. 19, a second substrate 340 is provided. The second substrate 340 may then be bonded to the front side of the first substrate 301. Further, a patterned mask layer 306 may be formed on the back side of the first substrate 301.

For a detailed description of the second substrate 340, one may refer to the embodiments described above. In one embodiment, a vacuum bonding process may be used to bond the first substrate 301 and the second substrate 340. The patterned mask layer 306 may expose a portion of the back side surface of the first substrate 301 corresponding to the open region 310. In one embodiment, the patterned mask layer 306 is made of a photoresist material.

Figure 20:
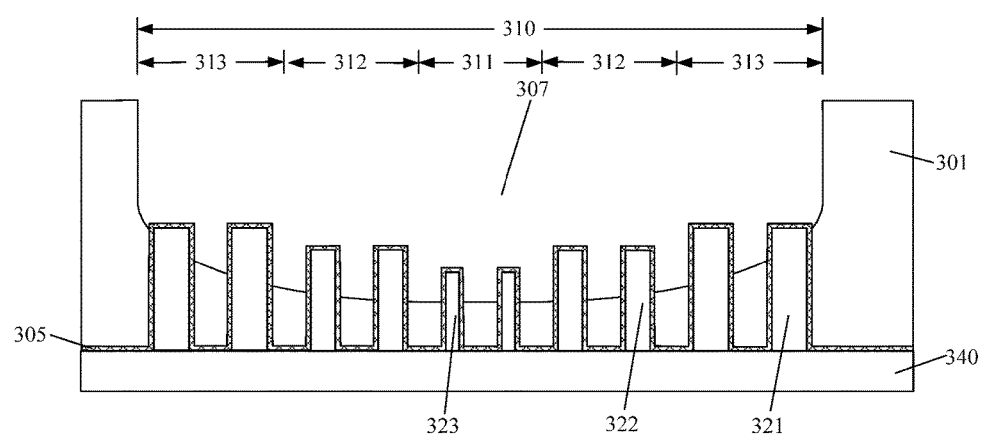

Further, returning to FIG. 22, a trench with a concave bottom surface towards the front side of the first substrate may be formed by etching from the back side of the first substrate (S206). FIG. 20 shows a schematic cross-section view of the corresponding structure.

Referring to FIG. 20, after forming the patterned mask layer 306, a trench 307 with a concave bottom surface towards the front side of the first substrate 301 may be formed by a dry etching process using the patterned mask layer 306 as an etch mask to etch the first substrate 301 along a direction from the back side to the front side of the first substrate 301.

In one embodiment, the central axis of the trench 307 may overlap with the central axis of the central region 311. After forming the trench 307, the portion of the photosensitive layer 305 formed on the bottom surfaces of the first openings 321, the bottom surfaces of the second openings 322, and the bottom surfaces of the third openings 323 may all be exposed.

Because of the etch loading effect of the dry etching process, the bottom surface of the trench 307 formed by the dry etching process may have a concave shape towards the front side of the first substrate 301. Specifically, the lowest point of the bottom surface of the trench 307 may be in the central region 311 while the sidewall of the trench 307 may be close to the peripheral region 313. In addition, the central axis of the trench 307 may overlap with the central axis of the central region 311, thus the lowest point of the bottom surface of the trench 307 and the lowest point may be in the central region 311.

Further, because the dimension of the trench 307 along the direction parallel to the front side of the first substrate 301 is larger than the dimensions of the first openings 321, the second openings 322, and the third openings 323, the etch loading effect may have a significant impact on the morphology of the bottom surface of the trench 307. Specifically, the etch loading effect may lead to a significantly recessed bottom surface of the trench 307 towards the front side of the first substrate 301. In the meantime, the etch loading effect may have a very limited impact on the first openings 321, the second openings 322, and the third openings 323. Therefore, the first openings 321, the second openings 322, and the third openings 323 may not have concave bottom surfaces.

In one embodiment, the depth of the first openings 321 in the first substrate 301 is larger than the depth of the third openings 323 in the first substrate 301. Thus, despite the concave bottom surface of the trench 307 towards the front side of the first substrate 301, the portion of the photosensitive layer 305 formed on the bottom surfaces of the first openings 321 may still be exposed after the dry etching process. Further, because the depth of the second openings 322 in the first substrate 301 may be larger than or equal to the depth of the third openings 323 in the first substrate 301, the portion of the photosensitive layer 305 formed on the bottom surfaces of the second openings 322 may also be exposed.

Because the portion of the photosensitive layer 305 formed on the bottom surfaces of the first openings 321, the second openings 322, and the third openings 323 may all be exposed, the ability of the MEMS device to sense light may be enhanced and, thus, the electronic performance of the MEMS device may be improved.

In the meantime, because the dimension of the first openings 321 along the direction parallel to the front side of the first substrate 301 may be larger than the dimension of the third opening 323 along the direction parallel to the front side of the first substrate 301, the area of the exposed portion of the photosensitive layer 305 on the first openings 321 may be larger than the area of the exposed portion of the photosensitive layer 305 on the third openings 323. Therefore, as compared to an MEMS device in which the first openings and the third openings have a same dimension along the direction parallel to the front side of the first substrate, an MEMS device in the present embodiment may have an enhanced ability to sense light and may demonstrate significantly-improved electronic performance.

Finally, the patterned mask layer 306 may be removed. The patterned mask layer 306 may be removed by an ashing process or a wet etching strip-removal process.

Accordingly, the present disclosure also provides an MEMS device. FIG. 20 shows a schematic cross-section view of the MEMS device.

Referring to FIG. 20, the MEMS device may include a first substrate 301 with an open region 310. The first substrate 301 may further include a front side and, opposite to the front side, a back side. The open region 310 may include a central region 311, a transitional region 312 surrounding the central region 311, and a peripheral region 313 surrounding the transitional region 312.

The MEMS device may include a plurality of first openings 321 formed in the first substrate 301 of the peripheral region 313, a plurality of second openings 322 formed in the first substrate 301 of the transitional region 312, and a plurality of third openings 323 formed in the first substrate 301 of the central region 311. The depths of the first openings 321, the second openings 322, and the third openings 323 may all be below the thickness of the first substrate 301.

The MEMS device may include a photosensitive layer 305 formed on the bottom and the sidewall surfaces of the first openings 321, the second openings 322, and the third openings 323. The MEMS device may further include a second substrate 340 which is bonded to the front side of the first substrate 301.

The MEMS device may also include a trench 307 formed on the opposite side of the open region 310 of the first substrate 301. The bottom of the trench 307 may have a concave shape recessing towards the front side of the first substrate 301. The trench 307 may expose a portion of the photosensitive layer 305 formed on the bottom surfaces of the first openings 321, the second openings 322, and the third openings 323.

A detailed description of the MEMS devices is provided as follows.

In one embodiment, the dimension of the first openings 321 along the direction parallel to the front side of the first substrate 301 may be larger than the dimension of the third opening 323 along the direction parallel to the front side of the first substrate 301.

The dimension of the second openings 322 along the direction parallel to the front side of the first substrate 301 may be larger than the dimension of the third openings 323 along the direction parallel to the front side of the first substrate 301 while the depth of the second openings 322 in the first substrate 301 may be larger than the depth of the third openings 323 in the first substrate 301. Alternatively, the dimension of the second openings 322 along the direction parallel to the front side of the first substrate 301 may be equal to the dimension of the third openings 323 along the direction parallel to the front side of the first substrate 301 while the depth of the second openings 322 in the first substrate 301 may be equal to the depth of the third openings 323 in the first substrate 301.

The dimension of the second openings 322 along the direction parallel to the front side of the first substrate 301 may be larger than, equal to, or smaller than the dimension of the first openings 321 along the direction parallel to the front side of the first substrate 301. In one embodiment, the dimension of the second openings 322 along the direction parallel to the front side of the first substrate 301 may be larger than the dimension of the third openings 323 along the direction parallel to the front side of the first substrate 301 but smaller than the dimension of the first openings 321 along the direction parallel to the front side of the first substrate 301. In addition, the second openings 322 may all have a same dimension along the direction parallel to the front side of the first substrate 301 and a same depth in the first substrate 301.

In certain other embodiments, different second openings 322 may have different dimensions along the direction parallel to the front side of the first substrate 301. Specifically, the dimensions of different second openings 322 along the direction parallel to the front side of the first substrate 301 may become smaller and smaller along the direction from the peripheral region 313 to the central region 311. Correspondingly, different second openings 322 may also have different depths in the first substrate 301. Specifically, the depths of second openings 322 in the first substrate 301 may become smaller and smaller along the direction from the peripheral region 313 to the central region 311.

The dimension of the first openings 321 along the direction parallel to the front side of the first substrate 301 may be in a range of 50 μm to 80 μm while the dimension of the third openings 323 along the direction parallel to the front side of the first substrate 301 is in a range of 30 μm to 50 μm.

The photosensitive layer 305 may be made of $SiO_x$. In one embodiment, the central axis of the trench 307 may overlap with the central axis of the central region 311, thus the lowest point of the bottom surface of the trench 307 may be in the central region 311.

The exposed portion of the photosensitive layer 305 may be used to sense external light. In one embodiment, because the portion of the photosensitive layer 305 formed on the bottom surfaces of the first openings 321, the second openings 322, and the third openings 323 may all be exposed, the ability of the MEMS device to sense light may be enhanced and, thus, the electronic performance of the MEMS device may be improved.

In the meantime, because the dimension of the first openings 321 along the direction parallel to the front side of the first substrate 301 may be larger than the dimension of the third opening 323 along the direction parallel to the front side of the first substrate 301, the area of the exposed portion of the photosensitive layer 305 on the first openings 321 may be larger than the area of the exposed portion of the photosensitive layer 305 on the third openings 323. Therefore, as compared to an MEMS device in which the first openings and the third openings have a same dimension along the direction parallel to the front side of the first substrate, an MEMS device in the present embodiment may have an enhanced ability to sense light and may demonstrate significantly-improved electronic performance.

Compared to existing MEMS devices and the fabrication methods, the disclosed MEMS device and fabrication method may demonstrate several advantages.

According to the disclosed fabrication method for MEMS devices, the bottom surface of the trench formed on the back side of the first substrate by etching may have a concave shape towards the front side of the first substrate due to the etch loading effect during the dry etching process. That is, the depth of the trench near the central region may be larger than the depth of the trench near the sidewall of the trench. In the present disclosure, a plurality of first openings may be formed in the first substrate in the peripheral region while a plurality of third openings may be formed in the first substrate in the central region.

In addition, the depth of the first openings in the first substrate may be larger than the depth of the third openings in the first substrate. The plurality of first openings are located close to the sidewall of the trench so that the concave bottom surface of the trench towards the front side of the first substrate may not only expose the portion of the photosensitive layer formed on the bottom surfaces of the third openings but also expose the portion of the photosensitive layer formed on the bottom surfaces of the first openings.

Therefore, the present disclosure may overcome the problems caused by the etch loading effect and ensure that the photosensitive layer formed on the bottom surfaces of the first openings as well as on the bottom surfaces of the third openings is exposed. As such, the ability of the MEMS device to sense external light may be enhanced, the electronic performance of the MEMS device may be improved, and the product yield of the MEMS device may also be improved.

Further, the open region in the present disclosure may also include a transition region, located between the central region and the peripheral region, and a plurality of second openings formed in the first substrate in the transition region. The depth of the second openings in the first substrate may be equal to or larger than the depth of the third openings in the first substrate. Because the depth of the second openings is not smaller than the depth of the third openings, the trench formed in a subsequent process may also expose the portion of the photosensitive layer formed on the bottom surfaces of the second openings.

Further, along a direction parallel to the front side of the first substrate, the dimension of the first openings may be larger than the dimension of the third openings. The plurality of first openings and the plurality of third openings may then be formed by a process including forming a patterned layer with a plurality of notches on the front side of the first substrate, wherein along the direction parallel to the front side of the first substrate, the dimension of the notches formed of the peripheral region may be larger than the dimension of the notches formed in the central region; etching a portion of the first substrate along the notches by using the patterned layer as an etch mask to form the plurality of first openings in the first substrate in the peripheral region while the plurality of the third openings in the first substrate in the central region.

Thus, only a patterning process and an etching process may be required to form desired first openings and third openings. Therefore, the method may lower production cost, reduce process difficulty, and avoid the alignment error problem due to forming multiple patterned layers. As such, the method may improve the reliability of the formed MEMS devices.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a micro-electro mechanical system (MEMS) device, comprising:
providing a first substrate with an open region, wherein the first substrate includes a front side and, opposite to the front side, a back side, and the open region includes a central region and a peripheral region adjacent to a sidewall of the open region surrounding the central region;

forming a plurality of first openings in the first substrate in the peripheral region and a plurality of third openings in the first substrate in the central region by etching the first substrate in the open region from the front side to the back side, wherein a depth of the first openings in the first substrate is larger than a depth of the third openings in the first substrate, while the depth of the first openings and the depth of the third openings are both smaller than a thickness of the first substrate;

forming a photosensitive layer, the photosensitive layer including:
a bottom portion of the photosensitive layer formed on bottom surfaces of each of the first openings and also on bottom surfaces of each of the third openings; and
a sidewall portion of the photosensitive layer formed on sidewall surfaces of each of the first openings and also on sidewall surfaces of each of the third openings;

providing a second substrate;

bonding the second substrate to the front side of the first substrate;

forming a patterned mask layer on the back side of the first substrate exposing a portion of the back side surface of the first substrate corresponding to the open region; and forming a trench in the first substrate by a dry etching process using the patterned mask layer as an etch mask and along an etching direction from the back side of the first substrate to the front side of the first substrate, wherein the trench has a concave bottom surface towards the front side of the first substrate, and all of the bottom portion of the photosensitive layer is above the concave bottom surface of the trench and at least a portion of each of the sidewall portion of the photosensitive layer is above the concave bottom surface of the trench.

2. The method for fabricating the MEMS device according to claim 1, wherein, along a direction parallel to the front side of the first substrate, a dimension of the first openings is larger than or equal to a dimension of the third openings.

3. The method for fabricating the MEMS device according to claim 1, wherein:
the open region further includes a transitional region;
the central region is surrounded by the transitional region and the transitional region is surrounded by the peripheral region; and
a plurality of second openings is formed in the first substrate in the transitional region.

4. The method for fabricating the MEMS device according to claim 3, wherein a depth of the second openings in the first substrate is larger than or equal to the depth of the third openings in the first substrate.

5. The method for fabricating the MEMS device according to claim 4, wherein:
the depth of the second openings in the first substrate is larger than the depth of the third openings in the first substrate; and
the depths of different second openings in the first substrate in the transitional region have a same value or become smaller and smaller along a direction from the peripheral region to the central region.

6. The method for fabricating the MEMS device according to claim 3, wherein, along a direction parallel to the front side of the first substrate, a dimension of the first openings is larger than a dimension of the third openings.

7. The method for fabricating the MEMS device according to claim 6, wherein, along a direction parallel to the front side of the first substrate, a dimension of the second openings is larger than or equal to the dimension of the third openings.

8. The method for fabricating the MEMS device according to claim 7, wherein, when the dimension of the second openings along the direction parallel to the front side of the first substrate is larger than the dimension of the third openings along the direction parallel to the front side of the first substrate, the dimensions of different second openings have a same value or become smaller and smaller along a direction from the peripheral region to the central region.

9. The method for fabricating the MEMS device according to claim 6, wherein:
the dimension of the first openings along the front side of the first substrate is in a range of 50 μm-80 μm; and
the dimension of the third openings along the front side of the first substrate is in a range of 30 μm-50 μm.

10. The method for fabricating the MEMS device according to claim 6, wherein the fabrication process for the first openings, the second openings, and the third openings further includes:
forming a patterned layer with a plurality of notches on the front side of the first substrate, wherein along the direction parallel to the front side of the first substrate, a dimension of the notches formed in the peripheral region is larger than a dimension of the notches formed in the central region;
forming the plurality of first openings, the plurality of second openings, and the plurality of third openings in the first substrate by etching a portion of the first substrate along the plurality of notches using the patterned layer as an etch mask; and
removing the patterned layer.

11. The method for fabricating the MEMS device according to claim 10, wherein along the direction parallel to the front side of the first substrate, a dimension of the notches formed in the transitional region is larger than or equal to the dimension of the notches formed in the central region.

12. The method for fabricating the MEMS device according to claim 1, wherein the photosensitive layer is made of $SiO_x$.

13. The method for fabricating the MEMS device according to claim 1, wherein the second substrate is bonded to the front side of the first substrate by a vacuum bonding process.

14. The method for fabricating the MEMS device according to claim 10, wherein the plurality of notches have a circular shape in a top view.

15. The method for fabricating the MEMS device according to claim 10, wherein the patterned layer is removed by an ashing process or a wet etching strip-removal process.

16. The method for fabricating the MEMS device according to claim 1, wherein a thickness of the photosensitive layer is in a range of 10 Å to 100 Å.

17. The method for fabricating the MEMS device according to claim 1, wherein a central axis of the trench overlaps with a central axis of the central region.

18. The method for fabricating the MEMS device according to claim 1, wherein an opening of the plurality of third openings, closest to the sidewall of the open region, has a bottom above the concave bottom surface of the trench.

* * * * *